(12) United States Patent
Jeong et al.

(10) Patent No.: US 8,736,540 B2
(45) Date of Patent: *May 27, 2014

(54) LIQUID CRYSTAL DISPLAY HAVING A GATE VOLTAGE GENERATOR FOR VARYING GATE ON/OFF VOLTAGE ACCORDING TO CHANGE IN TEMPERATURE

(75) Inventors: Eun-Woo Jeong, Seongnam-si (KR); Sang-Hoon Park, Yongin-si (KR); Hwan-Jun Sung, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/608,219

(22) Filed: Sep. 10, 2012

(65) Prior Publication Data

US 2013/0241912 A1    Sep. 19, 2013

Related U.S. Application Data

(62) Division of application No. 12/548,701, filed on Aug. 27, 2009, now Pat. No. 8,289,256.

(30) Foreign Application Priority Data

Aug. 29, 2008 (KR) ......................... 10-2008-0085282

(51) Int. Cl.
*G09G 3/36* (2006.01)

(52) U.S. Cl.
USPC .......................................................... 345/101

(58) Field of Classification Search
USPC .......................................................... 345/101
See application file for complete search history.

(56) References Cited

U.S. PATENT DOCUMENTS

| 8,289,256 B2 * | 10/2012 | Jeong et al. ...................... 345/94 |
| 2002/0003447 A1 | 1/2002 | Nagase et al. |
| 2007/0018933 A1 | 1/2007 | Lee |
| 2007/0035501 A1 | 2/2007 | Moh |
| 2008/0054987 A1 | 3/2008 | Choi et al. |
| 2008/0122829 A1 | 5/2008 | Park |
| 2008/0180082 A1 | 7/2008 | Fan |
| 2009/0109166 A1 | 4/2009 | Lee et al. |

FOREIGN PATENT DOCUMENTS

| JP | 06175620 | 6/1994 |
| JP | 2000010647 | 1/2000 |
| JP | 2001339869 | 12/2001 |

* cited by examiner

*Primary Examiner* — Long D Pham
(74) *Attorney, Agent, or Firm* — Cantor Colburn LLP

(57) ABSTRACT

A liquid crystal display (LCD) includes: a gate-off voltage generator including a temperature compensation unit which comprises a constant voltage output device and which outputs a gate-off voltage having a level which varies based on a change in ambient temperature;
a clock generator outputting a first clock signal and a second clock signal;
a gate driver outputting gate signals; and
a plurality of pixels which turn on or off based on the gate signals,
wherein the constant voltage output device outputs a temperature variable voltage having a value based on a voltage difference between a reference terminal of the constant voltage output device and an input terminal of the constant voltage output device, and a voltage difference between the reference terminal and the input terminal of the constant voltage output device varies based on the change in the ambient temperature.

8 Claims, 11 Drawing Sheets x : LOW TEMPERATURE
o : ROOM TEMPERATURE

LIQUID CRYSTAL DISPLAY HAVING A GATE VOLTAGE GENERATOR FOR VARYING GATE ON/OFF VOLTAGE ACCORDING TO CHANGE IN TEMPERATURE

CROSS REFERENCE TO RELATED APPLICATIONS

This application is a divisional of U.S. patent application Ser. No. 12/548,701, filed on Aug. 27, 2009, which claims priority to Korean Patent Application No. 10-2008-0085282, filed on Aug. 29, 2008, and all the benefits accruing therefrom under 35 U.S.C. §119, the contents of which in its entirety are herein incorporated by reference.

BACKGROUND OF THE INVENTION

1. Field of the Invention

The present invention relates to a liquid crystal display ("LCD"), and more particularly, to an LCD having a substantially reduced manufacturing cost and substantially improved display quality.

2. Description of the Related Art

A liquid crystal display ("LCD") typically includes a liquid crystal panel having a plurality of gate lines and a plurality of data lines disposed thereon, a gate driver which transmits a plurality of gate signals to gate lines of the plurality of gate lines, and a data driver which transmits a plurality of data signals to data lines of the plurality of data lines.

In conventional LCDs, a gate driver is implemented by mounting gate driver integrated circuits ("ICs") in a form such as of a tape carrier package ("TCP") or chip-on glass ("COG"), for example. However, research is being conducted to find better manufacturing methods in terms of manufacturing costs, product size and design, for example. More particularly, a method of mounting a gate driver, which generates gate signals using amorphous silicon thin-film transistors ("a-Si TFTs"), on a liquid crystal panel is being researched.

A gate driver mounted on a liquid crystal panel typically includes a plurality of stages, individual stages of which sequentially output gate signals. In addition, each of the individual stages includes at least one a-Si TFT.

However, driving capability of an a-Si TFT varies according to an ambient temperature in which the a-Si TFT is operated. In particular, when the ambient temperature decreases, the driving capability of the a-Si TFT substantially deteriorates. As a result, the a-Si TFT cannot output a gate signal having voltage level which is sufficient to turn on/off a switching device associated with a pixel.

The gate signals are generated using a clock signal and a clock bar signal which are provided to the gate driver, and the clock signal and the clock bar signal swing between a level of a gate-on voltage and a level of a gate-off voltage. Therefore, an LCD which controls the level of the gate-on voltage and the level of the gate-off voltage based on ambient temperature is required.

BRIEF SUMMARY OF THE INVENTION

Exemplary embodiments of the present invention provide a liquid crystal display ("LCD") which is manufactured at a substantially reduced cost and which has a substantially improved display quality.

According to an exemplary embodiment of the present invention, an LCD includes: a gate-off voltage generator including a temperature compensation unit which includes a constant voltage output device and a temperature-sensing device and which outputs a gate-off voltage whose level varies based on a change in ambient temperature; a clock generator receiving a gate-on voltage and the gate-off voltage and outputs a first clock signal and a second clock signal; a gate driver which receives the first clock signal and the second clock signal and outputs gate signals; and a plurality of pixels which are turned on or off based on the gate signals. The constant voltage output device outputs a temperature variable voltage whose value is determined by a voltage difference between a reference terminal of the constant voltage output device and an input terminal of the constant voltage output device. The temperature-sensing device provides an input voltage, whose value varies according to the change in the ambient temperature, and a voltage difference between the reference terminal of the constant voltage output device and the input terminal of the constant voltage output device does not substantially vary, regardless of the ambient temperature.

According to an alternative exemplary embodiment of the present invention, an LCD includes: a gate-off voltage generator including a temperature compensation unit which includes a constant voltage output device and outputs a gate-off voltage whose level varies based on a change in ambient temperature; a clock generator which receives a gate-on voltage and the gate-off voltage and outputs a first clock signal and a second clock signal; a gate driver which receives the first clock signal and the second clock signal and outputs gate signals; and a plurality of pixels which are turned on or off based on the gate signals. The constant voltage output device outputs a temperature variable voltage whose value is determined by a voltage difference between a reference terminal of the constant voltage output device and an input terminal of the constant voltage output device, and a voltage difference between the reference terminal of the constant voltage output device and the input terminal of the constant voltage output device varies based on the change in the ambient temperature.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
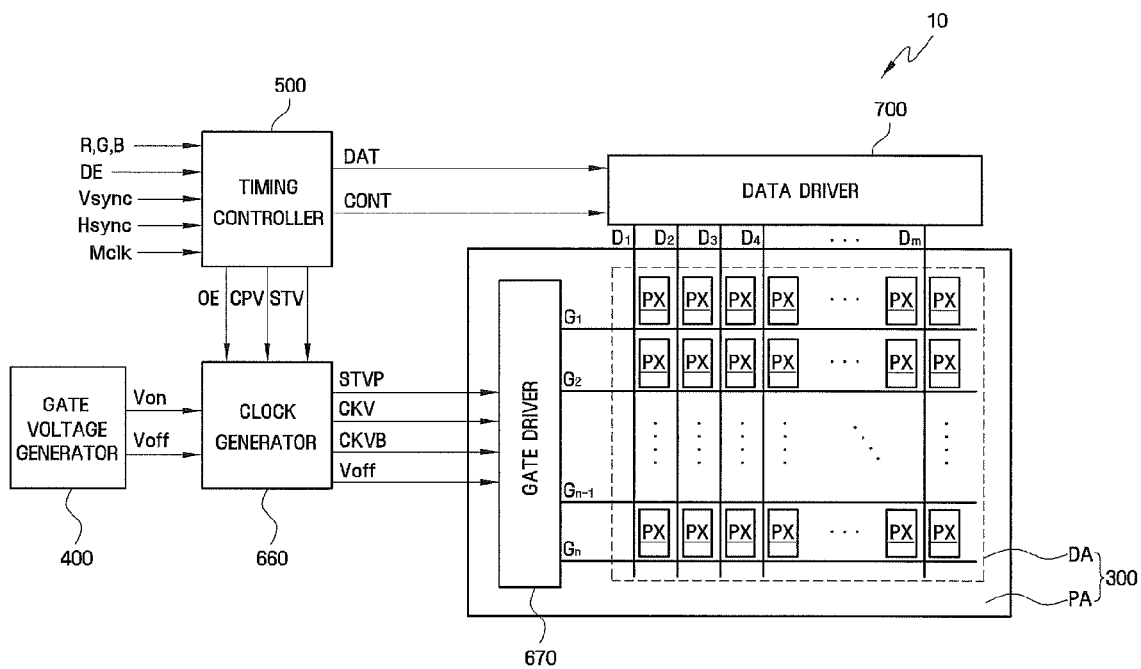
FIG. 1 is a block diagram of an exemplary embodiment of a liquid crystal display ("LCD") according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, a liquid crystal display ("LCD") according to an exemplary embodiment of the present invention will be described in further detail with reference to the accompanying drawings.

Figure 2:
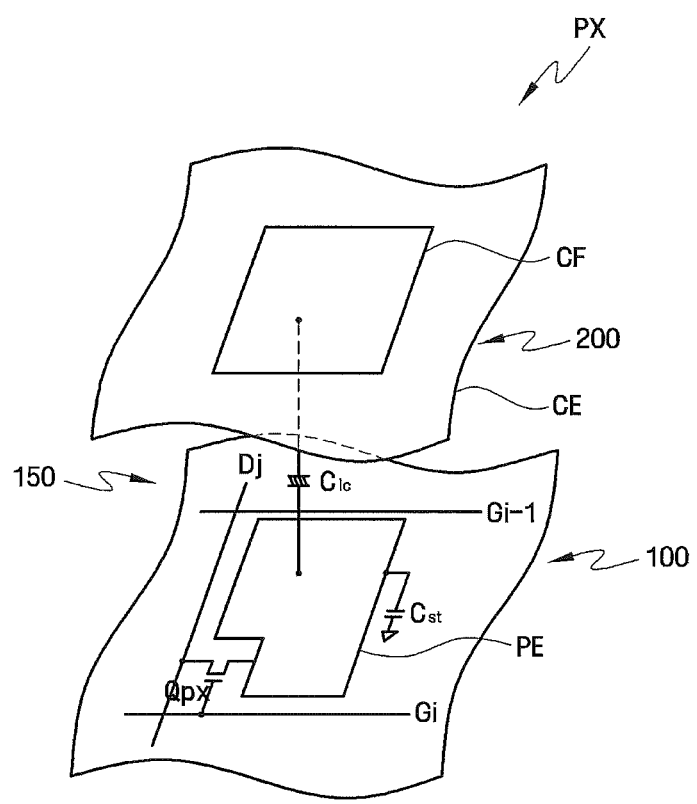
FIG. 2 is an equivalent schematic circuit diagram of a pixel of an exemplary embodiment of a liquid crystal panel of the LCD shown in FIG. 1.

FIG. 1 is a block diagram of an exemplary embodiment of an LCD 10 according to the present invention. FIG. 2 is an equivalent schematic circuit diagram of a pixel PX included in a liquid crystal panel 300 of the LCD 10 shown in FIG. 1.

Referring to FIG. 1, the LCD 10 includes a liquid crystal panel 300, a gate voltage generator 400, a timing controller 500, a clock generator 660, a gate driver 670 and a data driver 700.

The liquid crystal panel 300 is divided into a display region DA where images are displayed and a non-display region PA, e.g., a peripheral area PA, where no image is displayed.

The display region DA, in which the images are displayed, may include a first substrate 100 (FIG. 2) on which a plurality of gate lines G1 through Gn, a plurality of data lines D1 through Dm, a plurality of switching devices Qpx (FIG. 2), and a plurality of pixel electrodes PE (FIG. 2) are disposed, a second substrate 200 (FIG. 2) on which a plurality of color filters CF (FIG. 2) and a common electrode CE (FIG. 2) are disposed, and liquid crystal molecules 150 (FIG. 2) interposed between the first substrate 100 and the second substrate 200. Gate lines G1 through Gn of the plurality of gate lines G1 through Gn extend in a substantially row direction and are substantially parallel to each other, and data lines D1 through Dm of the plurality of data lines D1 through Dm extend in a substantially column direction, e.g., substantially perpendicular to th gate lines G1 through Gn, and are substantially parallel to each other.

Referring to FIG. 2, in each of the pixels PX (FIG. 1), a color filter CF is disposed proximate to a portion of the common electrode CE of the second substrate 200 to substantially face a pixel electrode PE disposed on the first substrate 100. In an exemplary embodiment, the pixel PX is connected to, for example, an $i^{th}$ (where i=1 to n) gate line Gi and a $j^{th}$ (where j=1 to m) data line Dj. The pixel PX may further include the switching device Qpx connected to the $i^{th}$ gate line Gi and the $j^{th}$ data line Dj, and a liquid crystal capacitor Clc and a storage capacitor Cst connected to the switching device Qpx. In an alternative exemplary embodiment, the storage capacitor Cst may be omitted. The switching device Qpx according to an exemplary embodiment is a thin-film transistor made of amorphous silicon ("a-Si"), for example.

The non-display region PA is where no image is displayed since the first substrate 100 is wider than the second substrate 200 in the non-display region PA. The gate driver 670 may be disposed in the non-display region PA.

The gate voltage generator 400 generates a gate-on voltage Von and a gate-off voltage Voff and provides the gate-on voltage Von and the gate-off voltage Voff to the clock generator 660. A level of the gate-on voltage Von and/or a level of the gate-off voltage Voff vary according to, e.g., based on, ambient temperature. In an exemplary embodiment, for example, the level of the gate-on voltage Von increases as the temperature rises and decreases as the temperature falls. In an alternative exemplary embodiment, however, the level of the gate-off voltage Voff may decrease as the temperature decreases and increase as the temperature increases. The gate voltage generator 400 will be described in further detail below.

The timing controller 500 receives input image signals R, G and B from an external graphic controller (not shown), as well as input control signals for controlling display of the input image signals R, G and B. In an exemplary embodiment, the input control signals include a vertical synchronization signal Vsync, a horizontal synchronization signal Hsync, a main clock signal Mclk and a data enable signal DE, for example.

The timing controller 500 generates data control signals CONT based on the input image signals R, G and B and the input control signals, and transmits the data control signals CONT and image data signals DAT to the data driver 700.

The timing controller 500 provides a first clock generation control signal OE, a second clock generation control signal CPV and an original scan start signal STV to the clock generator 660. In an exemplary embodiment, the first clock generation control signal OE enables a gate signal, and the second clock generation control signal CPV determine a duty ratio of the gate signal. The original scan start signal STV indicates start of a frame.

In response to the first clock generation control signal OE, the second clock generation control signal CPV, and the original scan start signal STV, the clock generator 660 outputs a clock signal CKV and a clock bar signal CKVB using the gate-on voltage Von and the gate-off voltage Voff received from the gate voltage generator 400. In addition, the clock signal CKV and the clock bar signal CKVB swing between, e.g., alternate between, the gate-on voltage Von and the gate-off voltage Voff and have different phases from each other.

The clock generator 660 converts the original scan start signal STV into a scan start signal STVP and provides the scan start signal STVP to the gate driver 670. In an exemplary embodiment, the scan start signal STVP is generated by increasing an amplitude of the original scan start signal STV.

When the ambient temperature decreases, the clock generator 660 outputs the clock signal CKV and the clock bar signal CKVB, which have increased amplitudes. When the ambient temperature increases, the clock generator 660 outputs the clock signal CKV and the clock bar signal CKVB which have reduced amplitudes. Thus, the clock generator 660 controls respective amplitudes of the clock signal CKV and the clock bar signal CKVB by increasing or decreasing levels of the gate-on voltage Von and/or the gate-off voltage Voff according to changes in ambient temperature.

The gate driver 670 is enabled by the scan start signal STVP, generates a plurality of gate signals using the clock signal CKV, the clock bar signal CKVB and the gate-off voltage Voff, and sequentially transmits the gate signals to the gate lines G1 through Gn. The gate driver 670 will be described in further detail below with reference to FIGS. 7 through 9.

The data driver 700 receives the image data signals DAT and the data control signals CONT from the timing controller 500 and provides image data voltages, corresponding to the image data signals DAT, to the data lines D1 through Dm. The data control signals CONT are used to control operation of the data driver 700 and include, for example, a horizontal start signal for starting the data driver 700 and a load signal for instructing the output of two data voltages.

In an exemplary embodiment, the data driver 700 is implemented using one or more integrated circuits ("ICs"), and may be connected to the liquid crystal panel 300 using a tape carrier package ("TCP"), for example. However, alternative exemplary embodiments of the present invention are not limited thereto. Moreover, the data driver 700 may be disposed in the non-display region PA of the liquid crystal panel 300.

Figure 3:
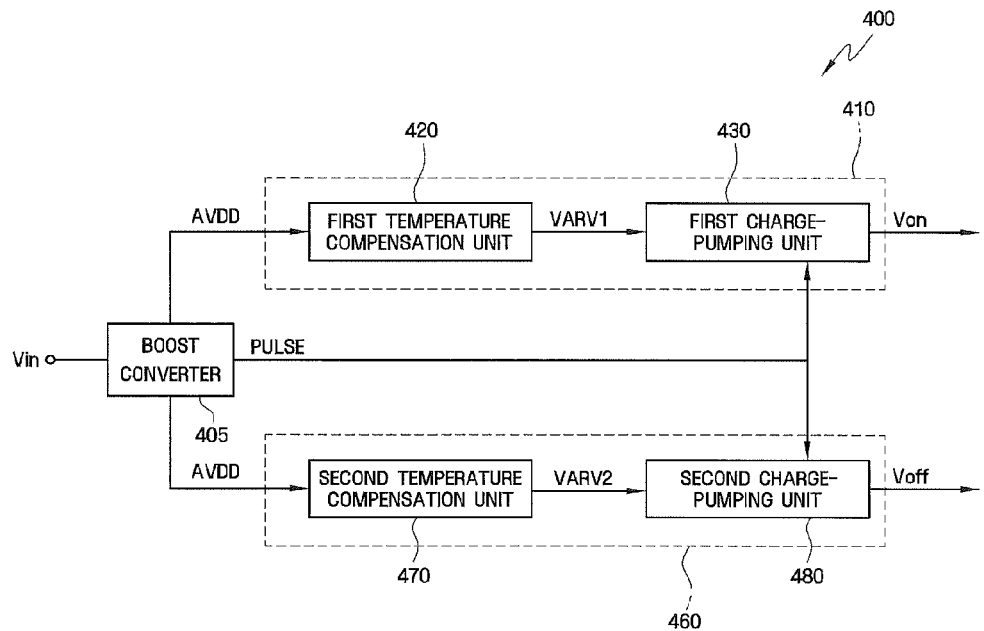
FIG. 3 is a block diagram of an exemplary embodiment of a gate voltage generator of the LCD shown in FIG. 1.
Figure 4:
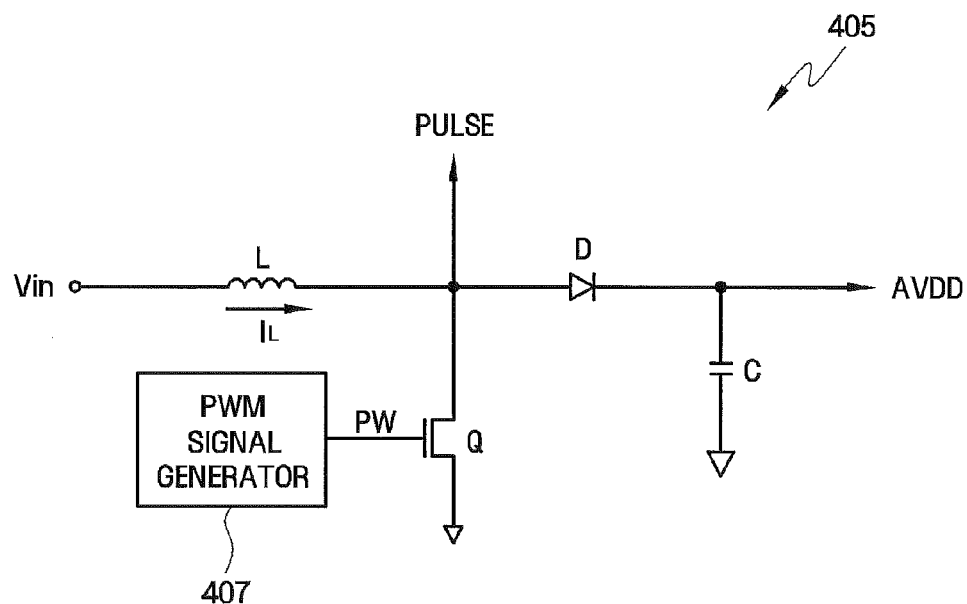
FIG. 4 is a schematic circuit diagram of an exemplary embodiment of a boost converter of the gate voltage generator shown in FIG. 3.

FIG. 3 is a block diagram of an exemplary embodiment of a gate voltage generator 400 of the LCD 10 shown in FIG. 1 and included in an LCD according to an exemplary embodiment of the present invention. FIG. 4 is a schematic circuit diagram of a boost converter 405 of the gate voltage generator shown in FIG. 3.

Referring to FIG. 3, the gate voltage generator 400 includes the boost converter 405, a gate-on voltage generator 410 and a gate-off voltage generator 460.

The boost converter 405 receives an input voltage Vin, boosts the input voltage Vin, and outputs a driving voltage AVDD and a pulse signal PULSE. The boost converter 405 may be, for example, a direct current to direct current ("DC-DC") converter or, alternatively, may be a different type of converter.

Referring to FIG. 4, the boost converter 405 includes an inductor L, a diode D, a capacitor C, and a pulse width modulation ("PWM") signal generator 407. The input voltage Vin is applied to the inductor L. The diode D includes an anode which is connected to the inductor L and a cathode which is connected to an output terminal of the boost converter 405 from which the driving voltage AVDD is outputted. In addition, the capacitor C is connected between the diode D and a ground, and the PWM signal generator 407 is connected to the anode of the diode D, as shown in FIG. 4.

The PWM signal generator 407 modulates an input signal and outputs the PWM signal PWM. Thus, the PWM signal generator 407 converts amplitude information of the input signal into time information, e.g., pulse width information. In an exemplary embodiment, for example, the PWM signal generator 407 may include a comparator (not shown). Further, the comparator may receive an input signal and a reference signal, and output the pulse signal PULSE at a high level when the amplitude of the input signal is greater than an amplitude of the reference signal, and output the pulse signal PULSE at a low level when the amplitude of the input signal is smaller than the amplitude of the reference signal.

When the PWM signal PW output from the PWM signal generator 407 is at a low level, a switching device Q is turned on and current $I_L$ flowing through the inductor L gradually increases in proportion to the input voltage Vin, which is applied to the inductor L, according to current and voltage characteristics of the inductor L.

When the PWM signal PW output from the PWM signal generator 407 is at a high level, the switching device Q is turned off and the current $I_L$ flowing through the inductor L flows through the diode D, and the capacitor C is charged according to current and voltage characteristics of the capacitor C. Therefore, the input voltage Vin is boosted to a predetermined voltage and is thereafter output as the driving voltage AVDD. As a result, the driving voltage AVDD and the pulse signal PULSE increase or decrease according to the PWM signal PW.

The gate-on voltage generator 410 receives the driving voltage AVDD and the pulse signal PULSE from the boost converter 405, and outputs the gate-on voltage Von. In an exemplary embodiment, the gate-on voltage generator 410 includes a first temperature compensation unit 420 and a first charge-pumping unit 430.

The first temperature compensation unit 420 outputs a first temperature variable voltage VARV1 whose level decrease as the ambient temperature rises and increases as the ambient temperature falls. In an exemplary embodiment, the first temperature compensation unit 420 may include a constant voltage output device and a temperature-sensing device. The constant voltage output device may output a temperature variable voltage whose value is determined by the voltage difference between a reference terminal of the constant voltage output device and an input terminal of the constant voltage output device. The temperature-sensing device may provide an input voltage, a value of which varies according to the change in ambient temperature, to the input terminal of the constant voltage output device.

The first charge-pumping unit 430 receives the first temperature variable voltage VARV1 and the pulse signal PULSE, shifts the first temperature variable voltage VARV1 in a positive direction by an amount substantially equal to the voltage level of the pulse signal PULSE, and outputs the gate-on voltage Von.

Thus, the gate-on voltage generator 410 outputs the gate-on voltage Von at a higher level when the ambient temperature falls and outputs the gate-on voltage Von at a lower level when the ambient temperature rises.

The gate-off voltage generator 460 receives the driving voltage AVDD and the pulse signal PULSE from the boost converter 405 and outputs the gate-off voltage Voff. The gate-off voltage generator 460 according to an exemplary embodiment includes a second temperature compensation unit 470 and a second charge-pumping unit 480.

Figure 5:
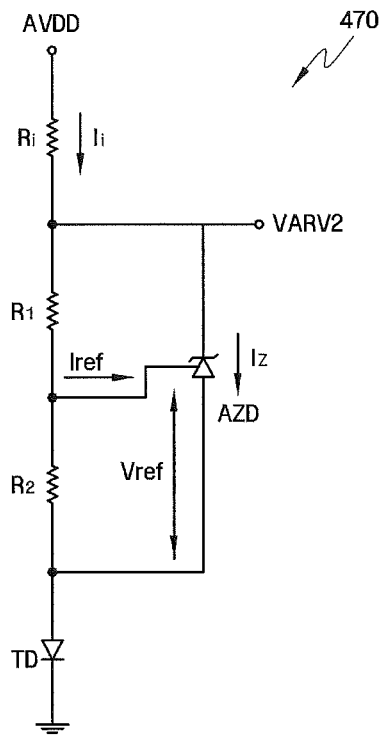
FIG. 5 is a schematic circuit diagram of an exemplary embodiment of a second temperature compensation unit of the gate voltage generator shown in FIG. 3.

The second temperature compensation unit 470 receives the driving voltage AVDD and outputs a second temperature variable voltage VARV2, a level of which increases as the ambient temperature increases and decreases as the ambient temperature decreases. The second temperature compensation unit 470 may include a constant voltage output device AZD (FIG. 5) and a temperature-sensing device TD (FIG. 5). The constant voltage output device may output a temperature variable voltage having a value determined by a voltage difference between a reference terminal of the constant voltage output device and an input terminal of the constant voltage output device. The temperature-sensing device provides an input voltage, a value of which varies according to the change in ambient temperature, to the input terminal of the constant voltage output device.

The second charge-pumping unit 430 receives the second temperature variable voltage VARV2 and the pulse signal PULSE, shifts the second temperature variable voltage VARV2 in a negative direction by an amount substantially equal to the voltage level of the pulse signal PULSE, and outputs the gate-off voltage Voff.

Thus, the gate-off voltage generator 460 outputs the gate-off voltage Voff at a lower level when the ambient temperature falls, and outputs the gate-off voltage Voff at a higher level when the ambient temperature rises.

Figure 6:
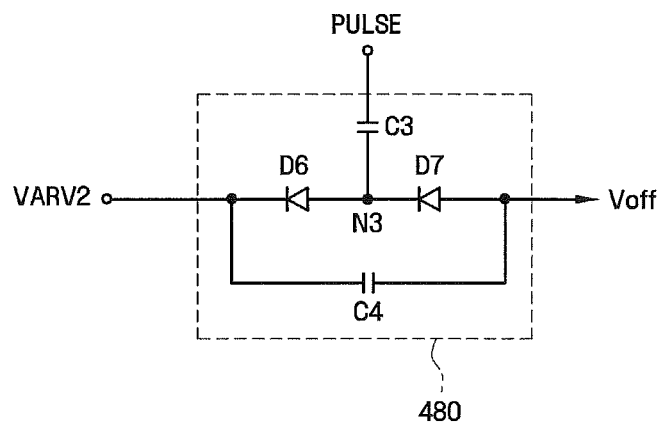
FIG. 6 is a schematic circuit diagram of an exemplary embodiment of a second charge-pumping unit of the gate voltage generator shown in FIG. 3.

The first temperature compensation unit 420 and the second temperature compensation unit 470, as well as the first charge-pumping unit 430 and the second charge-pumping unit 480, will now be described in further detail with reference to FIGS. 3, 5 and 6. FIG. 5 is a schematic circuit diagram of an exemplary embodiment of a second temperature compensation unit 470 of the gate driver 400 shown in FIG. 3 and included in an LCD 10 according to an exemplary embodiment of the present invention. FIG. 6 is a schematic circuit diagram of an exemplary embodiment of the second charge-pumping unit 480 of the gate driver 400 shown in FIG. 3. In FIGS. 5 and 6, a constant voltage output from a positive voltage output device may be represented as the first temperature variable voltage VARV1 or the second temperature variable voltage VARV2. For purposes of illustration herein, however, only the second temperature compensation unit 470 and the second charge-pumping unit 480 will be described in further detail. However, it will be noted that description of the structure and/or operating principle of the second temperature compensation unit 470 and the second charge-pumping unit 480 apply to the first temperature compensation unit 420 and the first charge-pumping unit 430.

Referring to FIG. 5, the second temperature compensation unit 470 may output a temperature variable voltage, e.g., the second temperature variable voltage VARV2, which is substantially proportional to a change in ambient temperature. For example, the second temperature compensation unit 470 may output the temperature variable voltage VARV2 at a lower level when the ambient temperature decreases.

The second temperature compensation unit 470 according to an exemplary embodiment includes a temperature-sensing device TD, a constant voltage output device AZD, a first resistor R1, a second resistor R2 and an input resistor Ri. As shown in FIG. 5, an input terminal of the constant voltage output device AZD is an anode of a Zener diode, an output terminal of the constant voltage output device AZD is a cathode of the Zener diode and a reference terminal of the constant voltage output device AZD is a terminal to which a reference current Iref is input.

The temperature-sensing device TD provides an input voltage, a value of which varies according to a change in ambient temperature, to the input terminal of the constant voltage output device AZD. In an exemplary embodiment, for example, a value of the input voltage provided by the temperature-sensing device TD decreases as the ambient temperature decreases. As shown in FIG. 5, the temperature-sensing device TD according to an exemplary embodiment is a diode. Moreover, a level of a forward voltage of the diode varies according to the change in ambient temperature. For example, the level of the forward voltage of the diode may decrease as the ambient temperature decreases.

The constant voltage output device AZD outputs a temperature variable voltage (e.g., the second temperature variable voltage VARV2) having a value which is determined by a voltage difference Vref between the reference terminal and the input terminal of the constant voltage output device AZD. In an exemplary embodiment, the voltage difference Vref between the reference terminal and the input terminal of the constant voltage output device AZD may be substantially constant regardless of changes in the ambient temperature.

As shown in FIG. 5, the constant voltage output device AZD is a Zener diode. The Zener diode may have a Zener breakdown voltage which is substantially proportional to the change in ambient temperature, and a corresponding Zener current Iz may therefore flow through the Zener diode.

The first resistor R1 may be connected between the output terminal and the reference terminal of the constant voltage output device AZD, and the second resistor R2 may be connected between the input terminal and reference terminal of the constant voltage output device AZD. As will be described in further detail below, a level of the temperature variable voltage (e.g., the second temperature variable voltage VARV2) may be determined by a resistance ratio of the first resistor R1 to the second resistor R2. In an exemplary embodiment, respective values of the first resistor R1 and the second resistor R2 may be substantially constant regardless of changes in the ambient temperature.

The input resistor Ri may be connected between a node of the second temperature compensation unit 470 to which the driving voltage AVDD is applied and a node of the second temperature compensation unit 470 from which the temperature variable voltage is output. Input current Ii flows through the input resistor Ri, and a voltage corresponding to a difference between the driving voltage AVDD and the temperature variable voltage (e.g., the second temperature variable voltage VARV2) may be applied to the input resistor Ri.

Operation of the second temperature compensation unit 470 will now be described in further detail. For purposes of explanation, it will be assumed that the second temperature compensation unit 470 does not include the temperature-sensing device TD. Thus, it will be assumed that the input terminal of the constant voltage output device AZD is grounded.

Based on this assumption, Kirchhoff's laws may be applied to the reference terminal of the constant voltage output device AZD to obtain values based on Equation (1) below.

$$VARV2 = Vref \times (1 + R1/R2) \quad (1)$$

Thus, the temperature variable voltage (e.g., the second temperature variable voltage VARV2) output from the constant voltage output device AZD may have a value substantially equal to a value obtained by multiplying a value, obtained by adding one to the resistance ratio of the first resistor R1 to the second resistor R2, by the voltage difference Vref between the reference terminal of the constant voltage output device AZD and input terminal of the constant voltage output device AZD. Moreover, the value of the temperature variable voltage given by Equation (1) corresponds to a value of the Zener breakdown voltage of the Zener diode. Specifically, since it has been assumed that the input terminal of the constant voltage output device AZD is grounded, the value of the temperature variable voltage is equal to that of the voltage applied between the anode and cathode of the Zener diode.

The voltage difference Vref between the reference terminal and the input terminal of the constant voltage output device AZD may be substantially constant regardless of changes in the ambient temperature. For example, the voltage difference Vref between the reference terminal and the input terminal of the constant voltage output device AZD may be maintained at about 2.5 V irrespective of any change in ambient temperature.

Therefore, a level of the temperature variable voltage (e.g., the second temperature variable voltage VARV2) may be determined using the resistance ratio of the first resistor R1 to the second resistor R2 as defined by Equation (2) below.

$$R1/R2 = VARV2/Vref - 1 \quad (2)$$

For example, when a temperature variable voltage of about −21 V is desired, the resistance ratio of the first resistor R1 to the second resistor R2 may be set to about 7.5 (R1/R2=21/2.5−1≈7.5). In this case, since a terminal from which the constant voltage is output is the cathode of the Zener diode, the level of the temperature variable voltage is about −21 V.

As described above, when it is assumed that the second temperature compensation unit 470 does not include the temperature-sensing device TD, e.g., when it is assumed that the input terminal of the constant voltage output device AZD is grounded, a temperature variable voltage (e.g., the second temperature variable voltage VARV2) whose level is determined by the resistance ratio of the first resistor R1 to the second resistor R2 is outputted.

However, in an exemplary embodiment wherein the second temperature compensation unit 470 includes the temperature-sensing device TD, the level of the temperature variable voltage (e.g., the second temperature variable voltage VARV2) varies according to changes in ambient temperature, which will now be described in further detail based on an assumption that the temperature-sensing device TD is a diode having a forward voltage which varies according to the change in ambient temperature.

The forward voltage of the diode, e.g., the temperature-sensing device TD, is about 0.7 V at a room temperature. Thus, about 0.7 V is applied to the input terminal of the constant voltage output device AZD at room temperature. The forward voltage of the diode may have a lower value at a lower temperature, e.g., at a temperature less than room temperature, than a value thereof at room temperature. Therefore, less than 0.7 V is applied to the input terminal of the constant voltage output device AZD at the lower temperature.

The temperature variable voltage (e.g., the second temperature variable voltage VARV2) output from the second temperature compensation unit 470 has a value obtained by subtracting the Zener breakdown voltage of the Zener diode (given by Equation (1), above) from the voltage level of the input terminal of the constant voltage output device AZD.

Therefore, the temperature variable voltage output from the second temperature compensation unit 470 may have a lower level at a lower temperature than a level thereof at a room temperature, since the temperature-sensing device TD provides an input voltage at a lower level at the lower temperature. Thus, the second temperature compensation unit 470 outputs the temperature variable voltage (e.g., the second temperature variable voltage VARV2) which is substantially proportional to the change in ambient temperature.

As described above with reference to FIG. 5, when a diode is used as the temperature-sensing device TD and when a Zener diode is used as the constant voltage output device AZD, a temperature compensation function is simply implemented, and thus manufacturing costs of an LCD 10 according to an exemplary embodiment is substantially reduced.

Referring to FIG. 6, the second charge-pumping unit 480 includes diodes D6 and D7 and capacitors C3 and C4. The second temperature variable voltage VARV2 is applied to a cathode of the diode D6, and a node N3 is connected to an anode of the diode D6. The capacitor C3 is connected between the node N3 and the pulse signal PULSE, as shown in FIG. 6. For example, a low level of the pulse signal PULSE can be provided to the capacitor C3. A cathode of the diode D7 is connected to the node N3, and an anode of the diode D7 outputs the gate-off voltage Voff. The capacitor C4 is connected between the cathode of the diode D6 and the anode of the diode D7.

When the pulse signal PULSE is provided to the capacitor C3, the node N3 outputs a pulse which is reduced from the second temperature variable voltage VARV2 by a value substantially equal to the voltage level of the pulse signal PULSE. In addition, the diode D7 and the capacitor C4 clamp the voltage of the node N3 and output the gate-off voltage Voff. Thus, the gate-off voltage Voff is a DC voltage obtained by shifting the second temperature variable voltage VARV2 in a negative direction by the voltage level of the pulse signal PULSE.

In an exemplary embodiment, the second charge-pumping unit 480 may include three or more diodes and three or more capacitors. For example, a combination of four diodes (not shown) and four capacitors (not shown) shifts the second temperature variable voltage VARV2 in a negative direction by twice the voltage level of the pulse signal PULSE. More generally, a combination of 2m (where m is a natural number) diodes and 2m capacitors shift the second temperature variable voltage VARV2 in a negative direction by m times the voltage level of the pulse signal PULSE.

Figure 7:
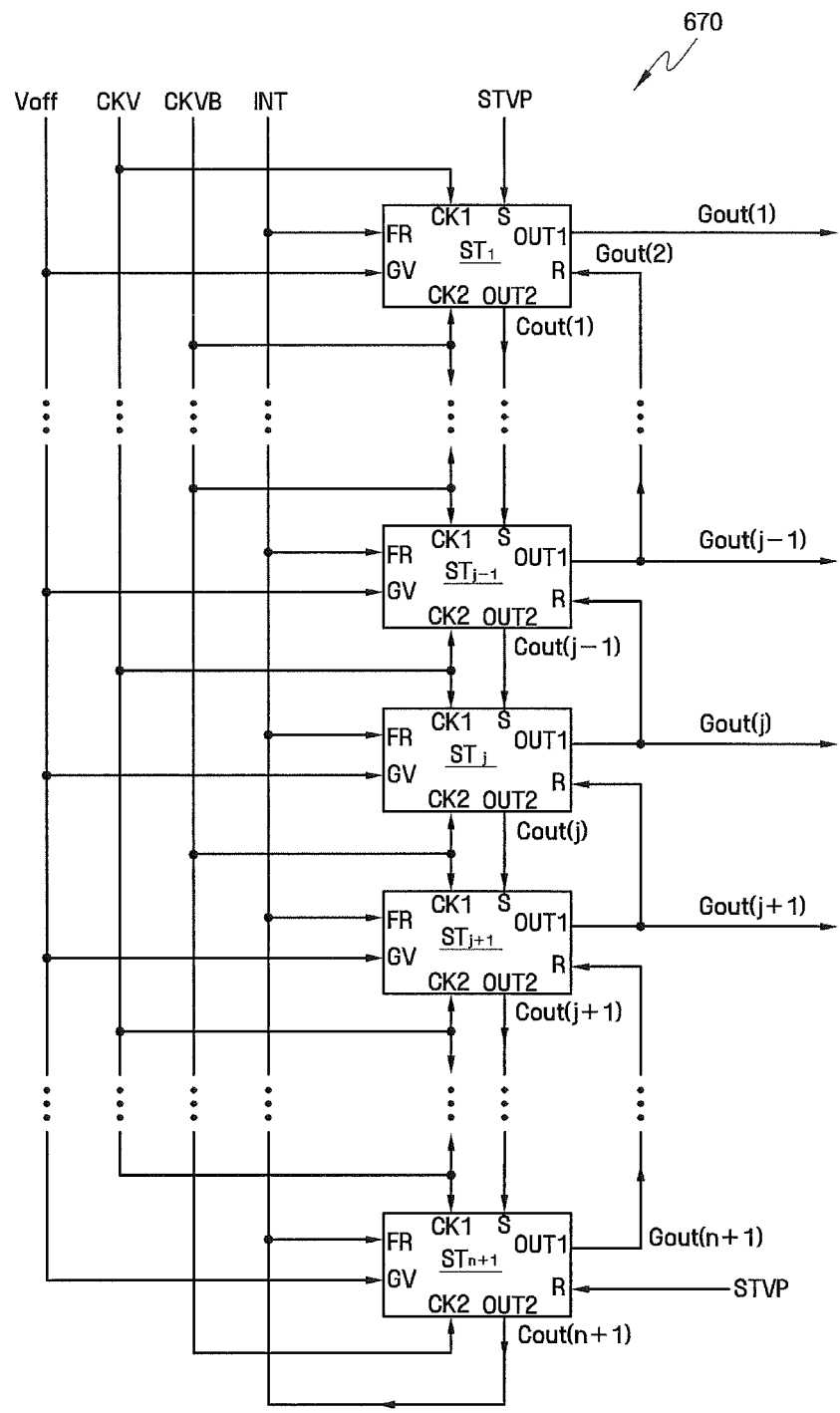
FIG. 7 is a block diagram of an exemplary embodiment of a gate driver of the LCD shown in FIG. 1.
Figure 8:
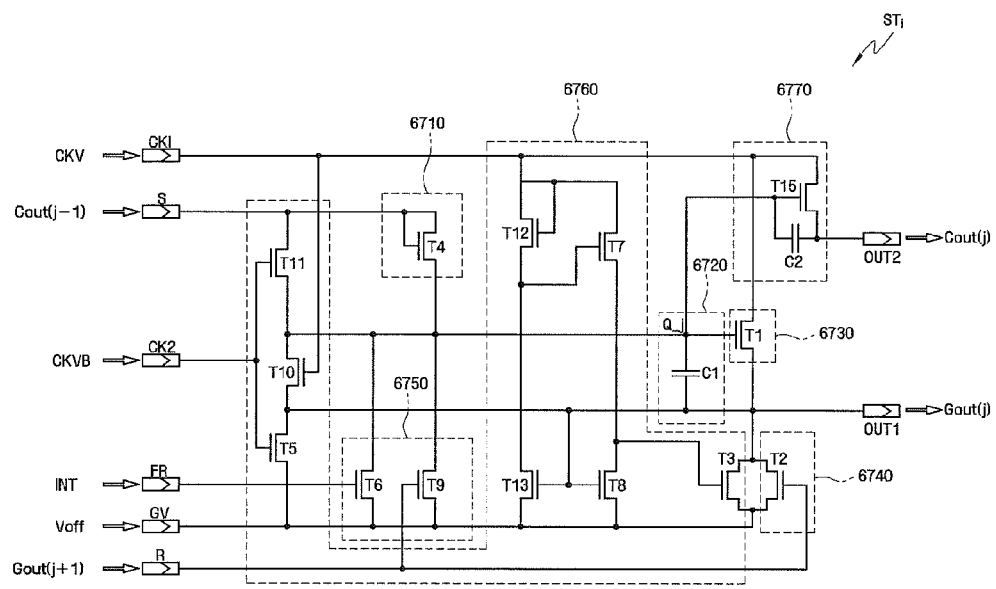
FIG. 8 is a schematic circuit diagram of an exemplary embodiment of a $j^{th}$ stage of the gate driver shown in FIG. 7.
Figure 9:
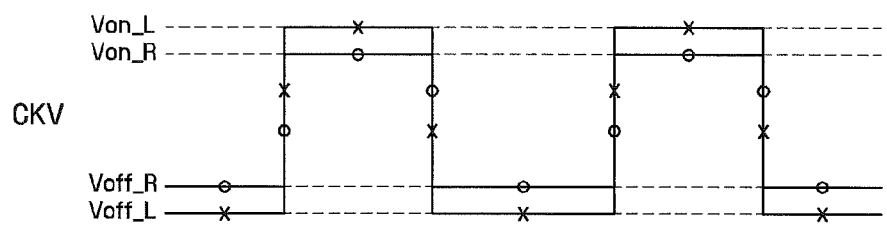
FIG. 9 is a signal timing diagram of an exemplary embodiment of a gate driver of the LCD shown in FIG. 1.
Figure 9:
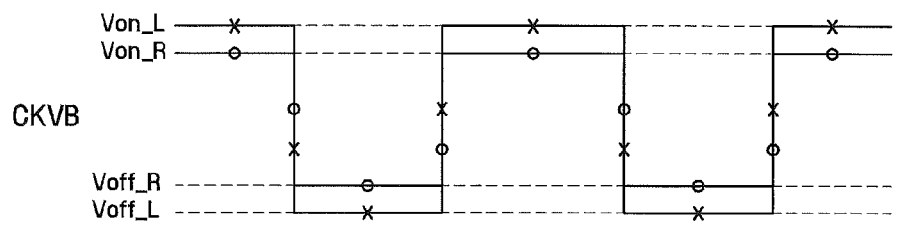
Figure 9:
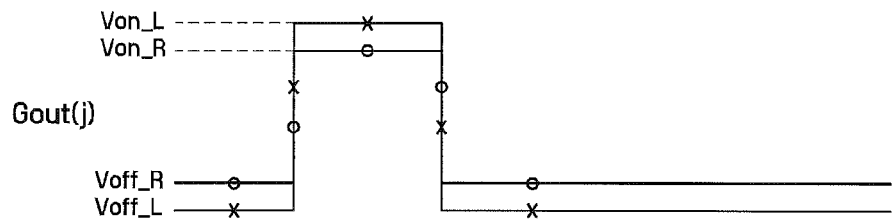

The gate driver 670 of FIG. 1 will now be described in further detail with reference to FIGS. 7 through 9. FIG. 7 is a block diagram of an exemplary embodiment of the gate driver 670 of the LCD 10 shown in FIG. 1. FIG. 8 is a schematic circuit diagram of an exemplary embodiment of a $j^{th}$ stage $ST_j$ of the gate driver 670 shown in FIG. 7. FIG. 9 is a signal timing diagram of an exemplary embodiment of the gate driver 670 of the LCD 10 shown in FIG. 1.

The gate driver 670 is enabled by the scan start signal STVP, generates a plurality of gate signals by using the clock signal CKV, the clock bar signal CKVB and the gate-off voltage Voff, and sequentially transmits the gate signals to the gate lines G1 through Gn, respectively.

More specifically and referring to FIG. 7, the gate driver 670 includes first through $(n+1)^{th}$ stages $ST_1$ through $ST_{n+1}$ which are connected to each other in a cascade manner. The first through $n^{th}$ stages $ST_1$ through $ST_n$, excluding the $(n+1)^{th}$ stage $ST_{n+1}$, are connected to the gate lines G1 through Gn, respectively, and output gate signals $Gout_{(1)}$ through $Gout_{(n)}$ to the gate lines G1 through Gn, respectively. The gate-off voltage Voff, the clock signal CKV, the clock bar signal CKVB, and an initialization signal NT are input to each of the first through $(n+1)^{th}$ stages $ST_1$ through $ST_{n+1}$. In an exemplary embodiment, the initialization signal INT is provided by the clock generator 660.

Each of the first through $(n+1)^{th}$ stages $ST_1$ through $ST_{n+1}$ includes a first clock terminal CK1, a second clock terminal CK2, a set terminal S, a reset terminal R, a voltage source terminal GV, a frame reset terminal FR, a gate output terminal OUT1 and a carry output terminal OUT2, as shown in FIG. 7.

For purposes of illustration, the $j^{th}$ stage $ST_j$ connected to the $j^{th}$ (j≠1) gate line Gj will now be described in further detail. A carry signal $Cout_{(j-1)}$ of a previous stage, i.e., the $(j-1)^{th}$ stage $ST_{j-1}$, is input to the set terminal S of the $j^{th}$ stage $ST_j$, a gate signal $Gout_{(j+1)}$ of a next stage, i.e., the $(j+1)^{th}$ stage $ST_{j+1}$, is input to the reset terminal R thereof, and the clock signal CKV and the clock bar signal CKVB are input to the first clock terminal CK1 and the second clock terminal CK2, respectively. In addition, the gate-off voltage Voff is input to the voltage source terminal GV of the $j^{th}$ stage $ST_j$, and the initialization signal NT or, alternatively, a carry signal $Cout_{(n+1)}$ of the last stage, i.e., the $(n+1)^{th}$ stage $ST_{n+1}$, is input to the frame reset terminal FR thereof. The gate output terminal OUT1 outputs a gate signal $Gout_{(j)}$, and the carry output terminal OUT2 outputs a carry signal $Cout_{(j)}$.

However, in the first stage $ST_1$, instead of a carry signal of a previous stage of the first stage $ST_1$, the scan start signal STVP is input. In addition, the scan start signal STVP is input to the last stage, e.g., the $(n+1)^{th}$ stage $ST_{n+1}$, instead of a gate signal of a next stage of the $(n+1)^{th}$ stage $ST_{n+1}$.

The $j^{th}$ stage $ST_j$ shown in FIG. 7 will now be described in further detail with reference to FIG. 8. Referring to FIG. 8, the $j^{th}$ stage $ST_j$ includes a buffer unit 6710, a charging unit 6720, a pull-up unit 6730, a carry signal generation unit 6770, a pull-down unit 6740, a discharging unit 6750 and a holding unit 6760. The carry signal $Cout_{(j-1)}$ of the previous stage, e.g., the $(j-1)^{th}$ stage $ST_{j-1}$, the clock signal CKV, and the clock bar signal CKVB are provided to the $j^{th}$ stage $ST_j$.

The buffer unit 6710 includes a diode-connected transistor T4. The buffer unit 6710 provides the carry signal $Cout_{(j-1)}$ of the previous stage, e.g., the $(j-1)^{th}$ stage $ST_{j-1}$, received through the set terminal S of the $j^{th}$ stage $ST_j$, to the charging unit 6720, the carry signal generation unit 6770 and the pull-up unit 6730.

The charging unit 6720 includes a capacitor C1 having a first terminal connected to a source of the transistor T4, the pull-up unit 6730 and the discharging unit 6750, and a second terminal connected to the gate output terminal OUT1.

The pull-up unit 6730 includes a transistor T1 having a drain connected to the first clock terminal CK1, a gate connected to the charging unit 6720, and a source connected to the gate output terminal OUT1.

The carry signal generation unit 6770 includes a transistor T15 and a capacitor C2. The transistor T15 includes a drain connected to the first clock terminal CK1, a source connected to the carry output terminal OUT2, and a gate connected to the buffer unit 6710. In addition, the capacitor C2 is connected to the gate and the source of the transistor T15.

The pull-down unit 6740 includes a transistor T2 having a drain connected to the source of the transistor T1 and the second terminal of the capacitor C1, a source connected to the voltage source terminal GV, and a gate connected to the reset terminal R.

The discharging unit 6750 includes transistors T6 and T9. The transistor T9 has a gate connected to the reset terminal R, a drain connected to the first terminal of the capacitor C1, and a source connected to the voltage source terminal GV. The transistor T9 discharges the charging unit 6720 in response to the gate signal $Gout_{(j+1)}$ of the next stage, i.e., the $(j+1)^{th}$ stage $ST_{(j+1)}$. In addition, the transistor T6 has a gate connected to the frame reset terminal FR, a drain connected to the first terminal of the capacitor C1, and a source connected to the voltage source terminal GV. The transistor T6 discharges the charging unit 6720 in response to the initialization signal NT.

The holding unit 6760 includes transistors T3, T5, T7, T8, T10, T11, T12 and T13. When the gate signal $Gout_{(j)}$ shifts from a low level to a high level, the holding unit 6760 holds the gate signal $Gout_{(j)}$ at the high level. Conversely, when the gate signal $Gout_{(j)}$ shifts from a high level to a low level, the holding unit 6760 holds the gate signal $Gout_{(j)}$ at the low level for a frame, without regard to voltage levels of the clock signal CKV and the clock bar signal CKVB.

The clock signal CKB and the clock bar signal CKVB, input to the gate driver 670, and the gate signal $Gout_{(j)}$, output from the gate driver 670, will now be described in further detail with reference to FIG. 9. As described in greater detail above, levels of the clock signal CKB and the clock bar signal CKVB vary according to temperature. Thus, the clock signal CKB and the clock bar signal CKVB may have a greater amplitude (Von_L to Voff_L) at a low temperature than an amplitude (Von_R to Voff_R) at a room temperature, for example. Accordingly, the gate signal $Gout_{(j)}$ obtained using the clock signal CKB and the clock bar signal CKVB may have a greater amplitude (Von_L to Voff_L) at the low temperature than an amplitude (Von_R to Voff_R) at the room temperature.

Since a driving margin is secured at relatively lower temperatures, a driving capability of the gate driver 670 is effectively prevented from deteriorating at the low temperature, and thus a display quality of the LCD 10 according to an exemplary embodiment is substantially enhanced.

Figure 10:
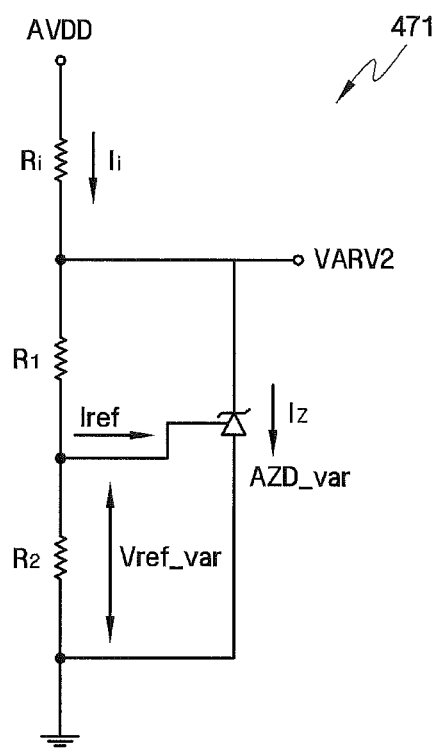
FIG. 10 is a schematic circuit diagram of an alternative exemplary embodiment of a second temperature compensation unit of the gate voltage generator shown in FIG. 3.

Hereinafter, an LCD according to an alternative exemplary embodiment of the present invention will now be described in further detail with reference to FIG. 10. FIG. 10 is a schematic circuit diagram of an exemplary embodiment of a second temperature compensation unit 471 of the gate driver 400 shown in FIG. 3 and included in an LCD 10 according to an alternative exemplary embodiment of the present invention. The same or like elements as those of exemplary embodiments of the present invention described in greater detail above are indicated by the same reference characters, and any substantially repetitive description thereof will hereinafter be omitted. For purposes of description, only the second temperature compensation unit 471 will be described in further detail. However, it will be noted that a detailed description of the structure and/or operating principle of the second temperature compensation unit 471 also apply to a first temperature compensation unit (not shown).

Referring to FIG. 10, the second temperature compensation unit 471 may output a second temperature variable voltage VARV2 which is substantially proportional to the change in ambient temperature. For example, the second temperature compensation unit 471 may output the second temperature variable voltage VARV2 at a lower level when the ambient temperature falls.

The second temperature compensation unit 471 includes a constant voltage output device AZD_var, a first resistor R1, a second resistor R2 and an input resistor Ri. As shown in FIG. 10, an input terminal of the constant voltage output device AZD_var is an anode of a Zener diode, an output terminal of the constant voltage output device AZD_var is a cathode of the Zener diode, and a reference terminal of the constant voltage output device AZD_var is a terminal to which a reference current Iref is inputted.

The constant voltage output device AZD_var outputs the second temperature variable voltage VARV2 having a value which is determined by a voltage difference Vref_var between the reference terminal of the constant voltage output device AZD_var and the input terminal of the constant voltage output device AZD_var. The voltage difference Vref_var between the reference terminal of the constant voltage output device AZD_var and the input terminal of the constant voltage output device AZD_var varies according to a change in ambient temperature. For example, the voltage difference Vref_var may increase when the ambient temperature decreases.

As shown in FIG. 10, the first resistor R1 is connected between the output terminal of the constant voltage output device AZD_var and reference terminal of the constant voltage output device AZD_var, and the second resistor R2 is connected between the input terminal of the constant voltage output device AZD_var and reference terminal of the constant voltage output device AZD_var. Values of the first resistor R1 and the second resistor R2 may be substantially constant regardless of changes in the ambient temperature.

Operation of the second temperature compensation unit 471 will now be described in further detail. Since the input terminal of the constant voltage output device AZD_var is grounded, Equation (1) (described in greater detail above) apply.

$$VARV2 = Vref \times (1 + R1/R2) \qquad (1).$$

Thus, the second temperature variable voltage VARV2 output from the constant voltage output device AZD_var has a value substantially equal to a value obtained by multiplying a value, obtained by adding one to a resistance ratio of the first resistor R1 to the second resistor R2, by the voltage difference Vref_var between the reference terminal of the constant voltage output device AZD_var and the input terminal of the constant voltage output device AZD_var. The value of the second temperature variable voltage VARV2, determine according to Equation (1), corresponds to a value of a Zener breakdown voltage of the Zener diode.

The voltage difference Vref_var between the reference terminal of the constant voltage output device AZD_var and the input terminal of the constant voltage output device AZD_var varies according to the change in ambient temperature. For example, the voltage difference Vref_var between the reference terminal of the constant voltage output device AZD_var and the input terminal of the constant voltage output device AZD_var may increase when the ambient temperature decreases.

Therefore, when the resistance ratio of the first resistor R1 to the second resistor R2 is substantially constant, the level of the second temperature variable voltage VARV2 output from the constant voltage output device AZD_var may increase. Since the output terminal, which outputs the second temperature variable voltage VARV2, is the cathode of the Zener diode, the level of the second temperature variable voltage VARV2 output from the constant voltage output device AZD_var has a negative value. Therefore, the second temperature variable voltage VARV2 output from the second temperature compensation unit 471 may have a lower level at a lower temperature than at a room temperature, e.g., at a higher temperature. Thus, the second temperature compensation unit 471 outputs the second temperature variable voltage VARV2 which is substantially proportional to the change in ambient temperature.

As described above in greater detail with reference to FIG. 10, when a Zener diode is used as the constant voltage output device AZD_var, the temperature compensation function is simply implemented, and thus a manufacturing cost of the LCD 10 according to an exemplary embodiment is substantially reduced.

Figure 11:
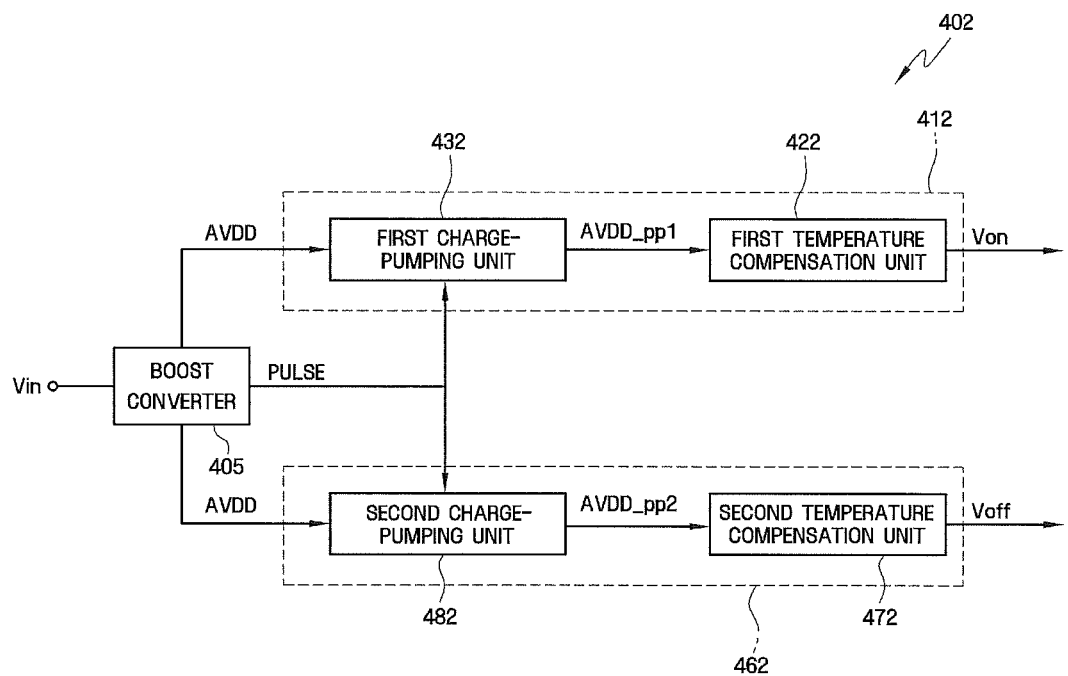
FIG. 11 is a block diagram of an exemplary embodiment of a gate voltage generator of the LCD shown in FIG. 1.
Figure 12:
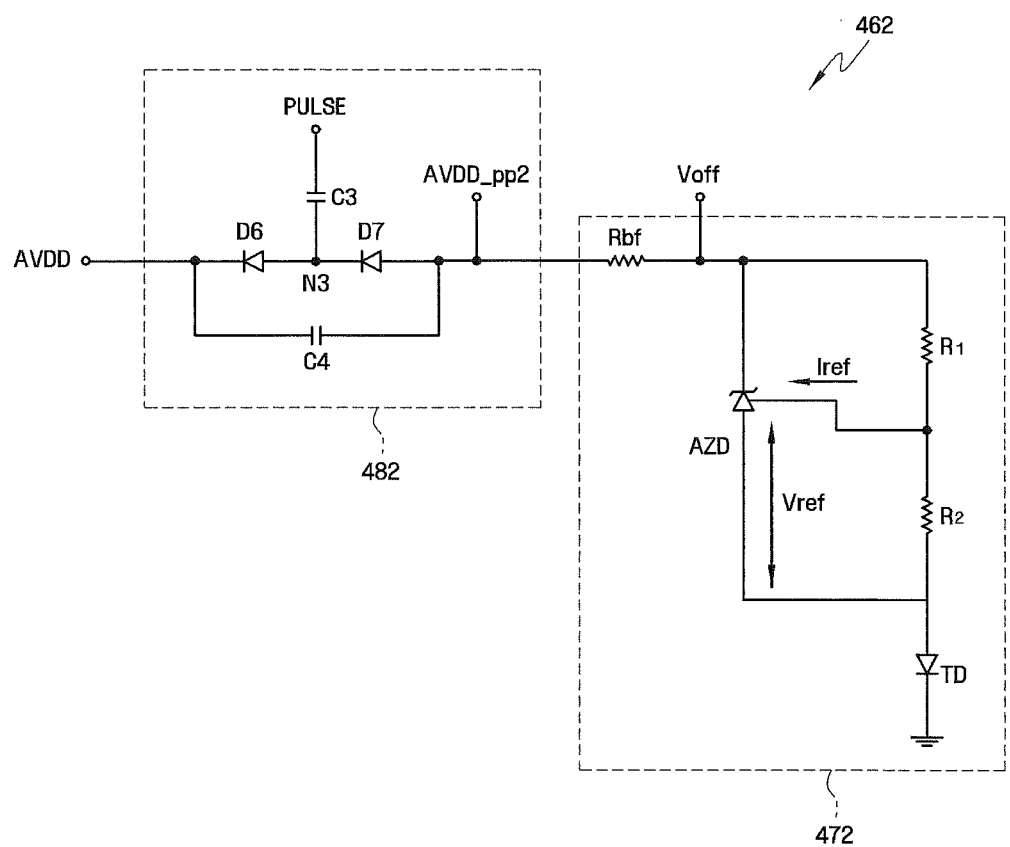
FIG. 12 is a schematic circuit diagram of an alternative exemplary embodiment of a second charge-pumping unit and a second temperature compensation unit of the gate voltage generator shown in FIG. 11.

Hereinafter, an LCD 10 according to another alternative exemplary embodiment of the present invention will be described in further detail with reference to FIGS. 11 and 12. FIG. 11 is a block diagram of an alternative exemplary embodiment of a gate voltage generator 402 of the LCD 10 shown in FIG. 1 and included in an LCD according to an alternative exemplary embodiment of the present invention. FIG. 12 is a schematic circuit diagram of an exemplary embodiment of a second charge-pumping unit 482 and a second temperature compensation unit 472 of the gate voltage generator 402 shown in FIG. 11 and included in the LCD 10 according to an alternative exemplary embodiment of the present invention. The same or like elements as those of exemplary embodiments described in greater detail above are denoted by the same reference numerals, and any substantially repetitive description thereof will hereinafter be omitted.

Referring to FIGS. 11 and 12, a temperature variable voltage output from a constant voltage output device is represented as a gate-on voltage Von or, alternatively, a gate-off voltage Voff. For purposes of description, the second charge-pumping unit 482 and the second temperature compensation unit 472 are illustrated in FIG. 12. However, it will be noted that structure and operating principles of the second charge-pumping unit 482 and the second temperature compensation unit 472 are substantially the same as those of a first charge-pumping unit 432 and a first temperature compensation unit 422, respectively.

Referring to FIGS. 11 and 12, the gate voltage generator 402 according to an alternative exemplary embodiment of the present invention includes a boost converter 405, a gate-on voltage generator 412 and a gate-off voltage generator 462.

The gate-on voltage generator 412 receives a driving voltage AVDD and a pulse signal PULSE from the boost converter 405 and outputs the gate-on voltage Von. The gate-on voltage generator 412 includes the first charge-pumping unit 432 and the first temperature compensation unit 422.

The first charge-pumping unit 432 receives the boosted driving voltage AVDD and the pulse signal PULSE, shifts the boosted driving voltage AVDD in a positive direction by a value substantially equal to the voltage level of the pulse signal PULSE, and outputs a positively pumped pumping voltage AVDD_pp1.

The first temperature compensation unit 422 receives the positively pumped pumping voltage AVDD_pp1 and outputs a temperature variable voltage, e.g., the gate-on voltage Von, having a level which varies according to the change in ambient temperature. The first temperature compensation unit 422 may output the temperature variable voltage, e.g., the gate-on voltage Von having level which decreases as the ambient temperature increases and increases as the ambient temperature decreases.

Although not shown in the drawing, the first temperature compensation unit 422 according to an exemplary embodiment may include a constant voltage output device and a temperature-sensing device. The constant voltage output device may output a temperature variable voltage whose value is determined by the voltage difference between a reference terminal of the constant voltage output device and an input terminal of the constant voltage output device. The temperature-sensing device may provide an input voltage, whose value varies according to the change in ambient temperature, to the input terminal of the constant voltage output device.

Accordingly, the gate-on voltage generator 412 may output the gate-on voltage Von at a higher level when the ambient temperature decreases and output the gate-on voltage Von at a lower level when the ambient temperature increases.

The gate-off voltage generator 462 receives the driving voltage AVDD and the pulse signal PULSE from the boost converter 405 and outputs the gate-off voltage Voff. The gate-off voltage generator 462 includes the second charge-pumping unit 482 and the second temperature compensation unit 472.

The second charge-pumping unit 482 receives the boosted driving voltage AVDD and the pulse signal PULSE, shifts the boosted driving voltage AVDD in a negative direction by a value substantially equal to the voltage level of the pulse signal PULSE, and outputs a negatively pumped pumping voltage AVDD_pp2.

The second temperature compensation unit 472 may receive the negatively pumped pumping voltage AVDD_pp2 and output a temperature variable voltage, e.g., the gate-off voltage Voff having a level which varies according to the change in ambient temperature. The second temperature compensation unit 472 may output the temperature variable voltage, e.g., the gate-off voltage Voff, whose level increases as the ambient temperature increases and decreases as the ambient temperature decreases.

Accordingly, the gate-off voltage generator 462 may output the gate-off voltage Voff at a lower level when the ambient temperature decreases and output the gate-off voltage Voff at a higher level when the ambient temperature decreases.

As shown in FIG. 12, the second temperature compensation unit 472 may include a temperature-sensing device TD, a constant voltage output device AZD, a first resistor R1, a second resistor R2 and a buffer resistor Rbf.

The buffer resistor Rbf may be connected between a node of the second temperature compensation unit 472, to which the negatively pumped pumping voltage AVDD_pp2 is applied, and a node of the second temperature compensation unit 472, from which the gate-off voltage Voff is output.

As described in greater detail above with reference to FIG. 12, when a diode is used as the temperature-sensing device TD and when a Zener diode is used as the constant voltage output device AZD, the temperature compensation function can be simply implemented, and thus a manufacturing cost of the LCD 10 according to an exemplary embodiment is substantially reduced.

Figure 13:
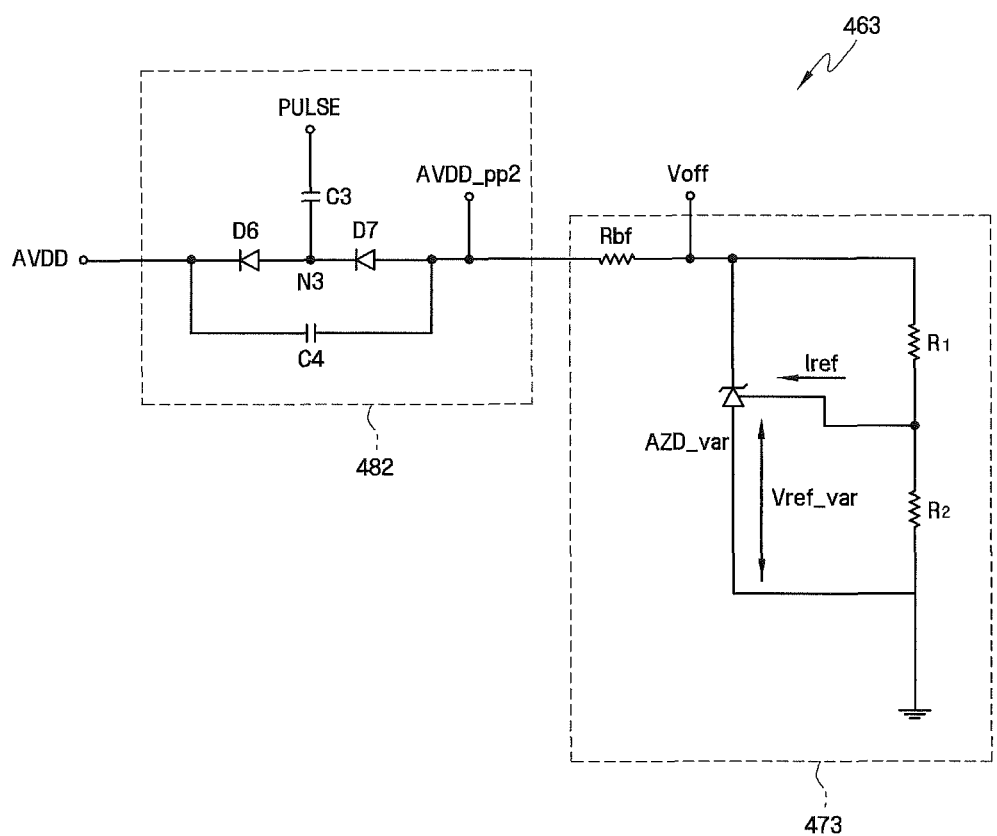
FIG. 13 is a schematic circuit diagram of another alternative exemplary embodiment of a second charge-pumping unit and a second temperature compensation unit of the gate voltage generator shown in FIG. 11.

Hereinafter, an LCD according to another alternative exemplary embodiment of the present invention will be described in further detail with reference to FIG. 13. FIG. 13 is a schematic circuit diagram of an alternative exemplary embodiment of a second charge-pumping unit 482 and a second temperature compensation unit 473 of the gate voltage generator 402 shown in FIG. 11 and included in an LCD 10 according to another alternative exemplary embodiment of the present invention. The same or like elements to those described in greater detail above are indicated by the reference characters, and any substantially repetitive detailed description thereof will hereinafter be omitted.

For purposes of description, the second charge-pumping unit 482 and the second temperature compensation unit 473 are illustrated in FIG. 13. However, it will be noted that the structure and operating principles of the second charge-pumping unit 482 and the second temperature compensation unit 473 are substantially the same as those of a first charge-pumping unit (not shown) and a first temperature compensation unit (not shown), respectively.

Referring to FIG. 13, the second temperature compensation unit 473 may output a temperature variable voltage, e.g., a gate-off voltage Voff which is substantially proportional to the change in ambient temperature. For example, the second temperature compensation unit 473 may output the temperature variable voltage at a lower level when the ambient temperature decreases.

The second temperature compensation unit 473 may include a constant voltage output device AZD_var, a first resistor R1, a second resistor R2 and an input resistor Ri. As shown in FIG. 13, an input terminal of the constant voltage output device AZD_var is an anode of a Zener diode, an output terminal of the constant voltage output device AZD_var is a cathode of the Zener diode, and a reference terminal of the constant voltage output device AZD_var is a terminal to which a reference current Iref is input.

The constant voltage output device AZD_var may output the temperature variable voltage whose value is determined by a voltage difference Vref_var between the reference terminal of the constant voltage output device AZD_var and the input terminal of the constant voltage output device AZD_var. The voltage difference Vref_var between the reference terminal of the constant voltage output device AZD_var and the input terminal of the constant voltage output device AZD_var may vary according to the change in ambient temperature. For example, the voltage difference Vref_var may increase when the ambient temperature increases.

The first resistor R1 is connected between the output terminal of the constant voltage output device AZD_var and the reference terminal of the constant voltage output device AZD_var, while the second resistor R2 is connected between the input terminal of the constant voltage output device AZD_var and the reference terminal of the constant voltage output device AZD_var. Values of the first resistor R1 and the second resistor R2 may be substantially constant without regard to changes in the ambient temperature.

An operation of the second temperature compensation unit 473 will now be described in further detail. Since the input terminal of the constant voltage output device AZD_var is grounded, Equation (1) (described above) may also be applied. That is, the temperature variable voltage output from the constant voltage output device AZD_var may have a value substantially equal to a value obtained by multiplying a value, obtained by adding one to a resistance ratio of the first resistor R1 to the second resistor R2, by the voltage difference Vref_var between the reference terminal of the constant voltage output device AZD_var and input terminal of the constant voltage output device AZD_var.

The voltage difference Vref_var between the reference terminal of the constant voltage output device AZD_var and the input terminal of the constant voltage output device AZD_var may vary according to the change in ambient temperature. For example, the voltage difference Vref_var between the reference terminal of the constant voltage output device AZD_var and the input terminal of the constant voltage output device AZD_var may increase when the ambient temperature decreases.

Therefore, when the resistance ratio of the first resistor R1 to the second resistor R2 is constant, the level of the temperature variable voltage output from the constant voltage output device AZD_var may increase. Since the output terminal, which outputs the temperature variable voltage, is the cathode of the Zener diode, the level of the temperature variable voltage output from the constant voltage output device AZD_var has a negative value. Therefore, the temperature variable voltage output from the second temperature compensation unit 473 may have a lower level at a low temperature than at a room temperature. In this way, the second temperature compensation unit 473 may output the temperature variable voltage which is substantially proportional to the change in ambient temperature.

As described herein, when a Zener diode is used as a constant voltage output device AZD_var, implementation a temperature compensation function is substantially simplified, and thus a manufacturing cost of an LCD according to an exemplary embodiment is substantially reduced.

The present invention should not be construed as being limited to the exemplary embodiments set forth herein. Rather, these exemplary embodiments are provided so that this disclosure will be thorough and complete and will fully convey the concept of the present invention to those skilled in the art The exemplary embodiments should be considered in a descriptive sense only and not for purposes of limitation. While the present invention has been particularly shown and described with reference to exemplary embodiments thereof, it will be understood by those of ordinary skill in the art that various changes in form and detail may be made therein without departing from the spirit or scope of the present invention as defined by the following claims.

What is claimed is:

1. A liquid crystal display comprising:
   a gate-off voltage generator including a temperature compensation unit which comprises a constant voltage output device and which outputs a gate-off voltage having a level which varies based on a change in ambient temperature;
   a clock generator receiving a gate-on voltage and the gate-off voltage and which outputs a first clock signal and a second clock signal;
   a gate driver which receives the first clock signal and the second clock signal and outputs gate signals; and
   a plurality of pixels which turn on or off based on the gate signals,
   wherein
   the constant voltage output device outputs a temperature variable voltage having a value based on a voltage difference between a reference terminal of the constant voltage output device and an input terminal of the constant voltage output device,
   a voltage difference between the reference terminal and the input terminal of the constant voltage output device varies based on the change in the ambient temperature, and
   the constant voltage output device comprises a Zener diode having a Zener breakdown voltage which is proportional to the change in the ambient temperature.

2. The liquid crystal display of claim 1, wherein the temperature compensation unit further comprises:
   a first resistor connected between an output terminal of the constant voltage output device and the reference terminal of the constant voltage output device; and
   a second resistor connected between the input terminal of the constant voltage output device and the reference terminal of the constant voltage output device,
   wherein values of the first resistor and the second resistor are substantially constant.

3. The liquid crystal display of claim 2, wherein a value of the temperature variable voltage is substantially equal to a value obtained by multiplying a value, obtained by adding one to a resistance ratio of the first resistor to the second resistor, by a voltage difference between the reference terminal of the constant voltage output device and the input terminal of the constant voltage output device.

4. The liquid crystal display of claim 1, further comprising:
   a boost converter outputting a driving voltage, which is generated by boosting an input voltage, and a pulse signal; and
   a charge-pumping unit shifting the temperature variable voltage by a voltage level of the pulse signal and outputting the gate-off voltage,
   wherein the temperature compensation unit receives the driving voltage and outputs the temperature variable voltage whose level varies according to the change in the ambient temperature.

5. The liquid crystal display of claim 1, further comprising:
   a boost converter which outputs a boosted driving voltage, generated by boosting an input voltage of the boost converter, and a pulse signal; and
   a charge-pumping unit which shifts the boosted driving voltage by a voltage level of the pulse signal and outputs a negatively pumped pumping voltage,
   wherein the temperature compensation unit receives the negatively pumped pumping voltage and outputs the temperature variable voltage having a level which varies based on the change in the ambient temperature.

6. The liquid crystal display of claim 1, further comprising a gate-on voltage generator which outputs the gate-on voltage having a level which varies based on the change in the ambient temperature, wherein the gate-on voltage generator comprises a temperature compensation unit having the constant voltage output device which outputs the temperature variable voltage having a value which is determined by a voltage difference between a reference terminal of the constant voltage output device and an input terminal of the constant voltage output device.

7. The liquid crystal display of claim 1, wherein a level of the gate-off voltage is proportional to the change in the ambient temperature.

8. The liquid crystal display of claim 1, wherein the gate driver comprises stages which sequentially output the gate signals, wherein each of the stages comprises at least one amorphous silicon thin-film transistor.

* * * * *